Dec. 11, 1962

C. A. HULTBERG 3,068,423

TRANSISTOR POWER AMPLIFIER

Filed May 26, 1960

Inventor

CARL A. HULTBERG

R. R. Anderson

By R. I. Tompkins Agent Attorney 3,068,423
TRANSISTOR POWER AMPLIFIER

Carl A. Hultberg, Lutherville, Md., assignor, by mesne assignments, to the United States of America as represented by the Secretary of the Navy Filed May 26, 1960, Ser. No. 32,054
2 Claims. (Cl. 330—14)

The present invention relates to a transistor power amplifier and more particularly to a transistor power amplifier wherein for a given magnitude of available driving power an output is realized which is nearly double the amount generally obtained from such circuits.

The utilization of transistors in electronic equipment, in lieu of vacuum tubes, with the resulting savings in space, weight, and power consumption is well known. However, in spite of these desirable features transistorized circuits, nevertheless, have limitations in the form of restricted output and also loss of power output usually associated with so-called "bias stabilization." The present invention attempts to overcome these difficulties, and is particularly advantageous for use with class B amplifiers in applications where current distortion is of little consequence, for example in a power amplifier used to energize a servo motor.

An object of the invention is to provide a transistor power amplifier with increased output.

Another object is to provide a transistor power amplifier having a push-pull output stage and class B operation.

A further object is to provide a transistor power amplifier wherein the final stage transistors have a common emitter lead.

Yet another object is to provide a transistor power amplifier which employs an inexpensive non-linear resistance element to accomplish increased power output.

Other objects and many of the attendant advantages of this invention will be readily appreciated as the same becomes better understood by reference to the following detailed description when considered in connection with the accompanying drawings wherein.

Figure 1:
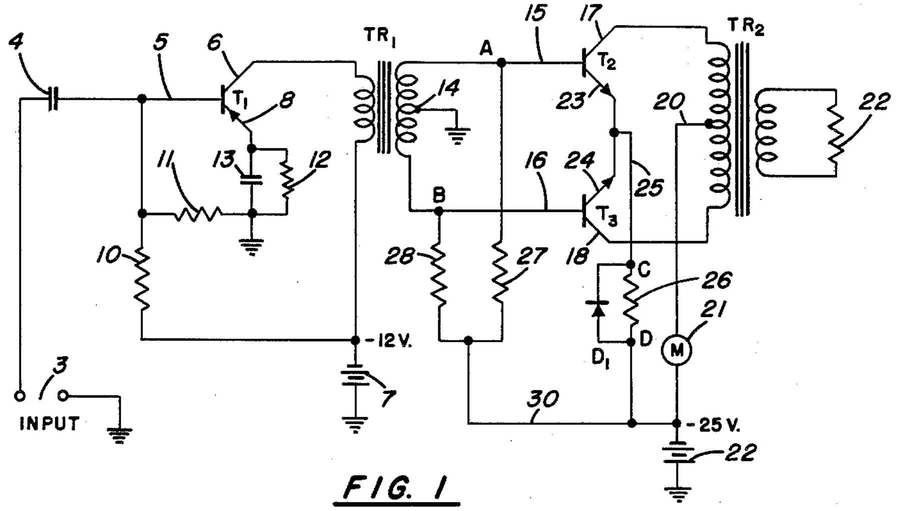
FIG. 1 shows a circuit diagram of the invention.

Referring now to the drawings there is shown in FIG. 1 an input terminal 3 which is connected to a coupling capacitor 4, this in turn connecting with the base lead 5 of a transistor $T_1$ which may be of any well known make, as for example a General Electric 2N–265. From the collector lead of $T_1$ a circuit is completed through the primary of a driver transformer $TR_1$ to a battery 7 and thence to ground. Joining the emitter lead 8 of transistor $T_1$ with battery 7 is a bias stabilizing network consisting of resistances 10, 11, and 12, the resistor 12 having a parallel-connected by-pass condenser 13 associated with it. A lead connecting the base 5 of $T_1$ with the junction of resistances 10 and 11 completes the network.

Proceeding now from the driver transformer $TR_1$ it will be observed that this transformer has a centertapped secondary winding which is attached to ground at 14. Connected across the ends of this secondary winding by base leads 15 and 16 are two transistors $T_2$ and $T_3$ which are arranged to provide a push-pull output stage for the amplifiers. Transistors $T_2$ and $T_3$ may be of any well known type, as for example Clevite 2N–268 transistors. Completing the output stage is an output transformer $TR_2$ having a centertapped primary the ends of which are connected to collectors 17 and 18 of transistors $T_2$ and $T_3$, respectively. Centertap 20 of transformer $TR_2$ connects through a current meter 21 to a battery 22 and thence to ground. The single-winding secondary of output transformer $TR_2$ furnishes power to any convenient load 22.

As will be observed from the drawing the emitter leads 23 and 24, of transistors $T_2$ and $T_3$, are tied together to form a common lead 25, this lead 25 having in series with it a dropping resistor 26 which in turn joins with battery 22 to apply potential to transistors $T_2$ and $T_3$. Connected across resistor 26 so as to form a shunt therefor is a non-linear resistor $D_1$ consisting of an inexpensive silicon power rectifier diode. It is this diode which forms the basis for the increased output of the present amplifier as will be obvious hereinafter.

Completing the amplifier are resistors 27 and 28 which are tied to base 15 of transistor $T_2$ and base 16 of transistor $T_3$, respectively. The common junction of these resistors are connected to the common terminal of battery 22 and diode $D_1$ by a lead 30.

Figure 2:
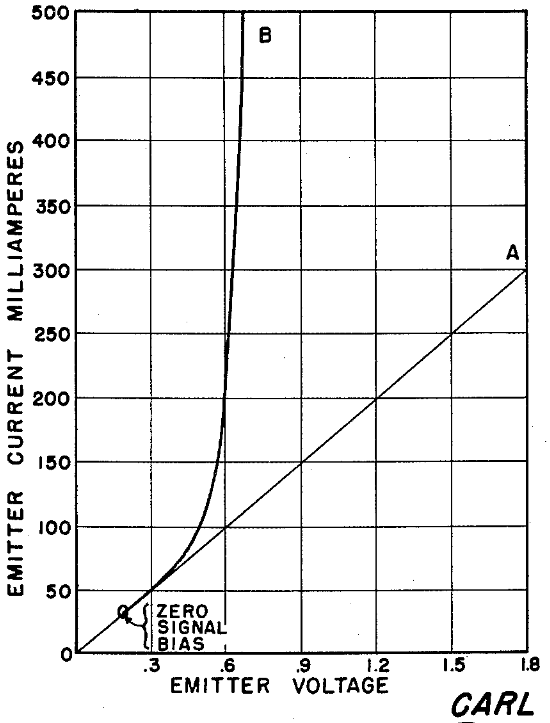
FIG. 2 is a plot of emitter current against emitter voltage for the circuit of FIG. 1.

Referring now to the graph of FIG. 2 there will be observed two curves which are formed by plotting emitter current in milliamperes against emitter voltage. In curve A an unshunted 6 ohm resistor is employed at 26 in FIG. 1, and the emitter current increases in a straight line as emitter voltage increases. One the other hand, curve B shows the effect of shunting the 6 ohm resistor 26 with a properly polarized diode, of the type GE 536, for example. Here it will be seen that shunting the resistor with a non-linear resistance of the type indicated does not cause a measurable change in the zero-signal bias operation, but does not produce a marked increase in current output with very little increase in emitter voltage.

In operation, an input signal from any convenient source of signals is applied to the input terminal 3 and passes through the coupling capacitor 4 to the base 5 of the driver stage $T_1$. In order to achieve a stable zero signal bias in a transistor amplifier, bias stabilizing networks are required, and the combination of resistors 10, 11, and 12 along with capacitor 13 function to bias transistor $T_1$ through connections to emitter 8 and base 5. The driver stage transistor $T_1$ is thus biased such that the current from collector 6 and through the driver transformer $TR_1$ is zero for up to one half cycle of the input signal, that is to say, in class B operation.

From the driver transformer $TR_1$ the signal is divided by means of the centertapped secondary winding and applied to bases 15 and 16 of transistors $T_2$ and $T_3$, the resistors 27 and 28 acting to bias the two transistors for class B operation. Collectors 17 and 18, being connected to opposite ends of output transformer $TR_2$ primary provide push-pull operation for impressing the amplified signal on load 22.

As observed in FIG. 1, emitters 23 and 24 are joined together and pass current through emitter resistor 26, which in turn is shunted by the non-linear resistance $D_1$. For very small signals equal and opposite amplified signal currents flow in resistor 26 and have no effect on alternating current gain. During class B operation, however, with its relatively high current flow for at least one half the signal cycle, large degenerative currents flow in resistor 26. Hence for economical operation resistor 26 should be small for large signal currents. The curves of FIG. 2 indicate that shunting resistor 26 with a non-linear resistance of the type indicated does not cause a measurable change in the zero signal bias operation, but does produce a marked reduction in resistance at high current levels. The end result is an output from the final amplifier which is nearly double that ordinarily obtained for a given magnitude of available driving power.

Obviously many modifications and variations of the present invention are possible in the light of the above teachings. It is therefore to be understood that within the scope of the appended claims, the invention may be practiced otherwise than as specifically described.

What is claimed is:

1. A transistor amplifier comprising an input stage, a coupling transformer connected to the input stage, a pair of transistors connected to the coupling transformer, a centertapped output transformer joining the collectors of the transistors, a common lead joining the emitters of the transistors, a first resistor connected in the lead, and a diode connected in parallel with said resistor to form a non-linear bias, second and third resistors connected at one end to the bases of said transistors and in common at the other end, said non-linear bias being connected to the resistor common junction.

2. A transistor amplifier comprising an input stage, a coupling transformer having a centertapped secondary connected to the input stage, a first transistor having its base connected to one end of the coupling transformer, a second transistor having its base connected to the other end of the coupling transformer, an output transformer having a centertapped primary, the collector of the first transistor being connected to one end of the centertapped primary, the collector of the second transistor being connected to the other end of the centertapped primary, a lead joining the emitters of the transistors, a first resistance connected in the lead, and a diode connected in parallel across the first resistance, second and third resistances connected to the bases of said first and second transistors at one end and in common at the other end, said first resistance being connected to the common junction of said second and third resistance to non-linearly increase the gain.

References Cited in the file of this patent

UNITED STATES PATENTS

| | | |
|---|---|---|
| 2,548,901 | Moe | Apr. 17, 1951 |
| 2,802,071 | Lin | Aug. 6, 1957 |
| 2,866,859 | Stanley | Dec. 30, 1958 |
| 2,951,208 | Barton | Aug. 30, 1960 |

FOREIGN PATENTS

| | | |
|---|---|---|
| 933,764 | Germany | Oct. 6, 1955 |

OTHER REFERENCES

Millard Advertisement, Wireless World, Jan. 1957, page 98 (advertisement).

Shea text: "Principles of Transistor Circuits," 1953, pages 349–351.